United States Patent
Schimanek et al.

(10) Patent No.: US 7,035,064 B2
(45) Date of Patent: Apr. 25, 2006

(54) METHOD AND CIRCUIT ARRANGEMENT WITH ADAPTIVE OVERLOAD PROTECTION FOR POWER SWITCHING DEVICES

(75) Inventors: Ernst Schimanek, Nuremberg (DE); Markus Billmann, Nuremberg (DE)

(73) Assignee: Semikron Elektronik GmbH, Nuremberg (DE)

(*) Notice: Subject to any disclaimer, the term of this patent is extended or adjusted under 35 U.S.C. 154(b) by 435 days.

(21) Appl. No.: 10/411,875

(22) Filed: Apr. 10, 2003

(65) Prior Publication Data
US 2003/0214770 A1    Nov. 20, 2003

Related U.S. Application Data

(63) Continuation-in-part of application No. 09/320,871, filed on May 27, 1999, now abandoned.

(30) Foreign Application Priority Data

May 29, 1998    (DE) ............................... 198 24 064

(51) Int. Cl.
*H02H 7/09*    (2006.01)
(52) U.S. Cl. .......................................... 361/23; 361/33
(58) Field of Classification Search ................. 361/18, 361/23, 24, 25, 91.1, 93.7, 93.8, 93.9, 103, 361/110, 111, 33
See application file for complete search history.

(56) References Cited
U.S. PATENT DOCUMENTS 5,057,962 A * 10/1991 Alley et al. .................... 361/24
5,436,784 A * 7/1995 Schweitzer et al. ........... 361/25
5,608,595 A * 3/1997 Gourab et al. ................ 361/79
5,894,394 A * 4/1999 Baba et al. .................... 361/87

FOREIGN PATENT DOCUMENTS

| DE | 41 05 155 A1 | 9/1992 |
| DE | 43 19 254 A1 | 12/1993 |
| DE | 42 40 501 A1 | 6/1994 |
| DE | 44 10 978 A1 | 10/1994 |
| DE | 44 21 529 A1 | 12/1995 |
| DE | 195 19 538 A1 | 11/1996 |
| DE | 196 28 131 C2 | 1/1998 |
| EP | 0 190 925 B1 | 8/1986 |

* cited by examiner

*Primary Examiner*—Brian Sircus
*Assistant Examiner*—Danny Nguyen
(74) *Attorney, Agent, or Firm*—Darby & Darby

(57) ABSTRACT

Dynamic thresholds for power circuit switch operation are calculated in real-time using instantaneous operating parameter measurements. The dynamic thresholds are self-adapting and are used to provide shutdown criteria independent of switch control systems. A characteristics field containing information related to operation parameters is used to make overload evaluations in real-time. These dynamic overload evaluations allow complete protection against thermal overload for entire power circuits in addition to power components. Reserve load capacity can also be determined based on well known component characteristics, which permits the power circuit to be driven at optimal efficiency. The power circuit output profile can also be modified in response to dynamic overload evaluation, thus preventing overload shutdown or damage to components, while operating at optimal efficiency.

12 Claims, 5 Drawing Sheets

METHOD AND CIRCUIT ARRANGEMENT WITH ADAPTIVE OVERLOAD PROTECTION FOR POWER SWITCHING DEVICES

This application is a continuation-in-part of U.S. Ser. No. 09/320,871, filed May 27, 1999.

BACKGROUND OF THE INVENTION

The invention relates to a circuit arrangement for current converters. More particularly, the invention relates to a method and circuit arrangement with adaptive overload protection for use with power switching devices, including Isolated Gate Bi-polar Transistor (IGBT) or Metal Oxide Semiconductor Field Effect Transistor (MOSFET) switches including associated free-running diodes.

Several types of circuits with overload protection for power semiconductor components are known. However, ever increasing power density demands strain the reliability and non-destructive operation of such circuits.

Conventional arrangements of power circuits using modem components experience a variety of errors. Such circuits include transistor switches using IGBT and MOS-FET technology, and modem free-running diodes with soft-recovery behavior as shown in DE 4421529A1. The errors experienced, while conventional in nature, may adversely impact the drive circuit. The impact of such errors may lead to false gating, which in turn can cause the circuit to fail, or introduce other serious negative effects in the functional operation of the circuit.

Power circuits with very high component density tend to exhibit particular drawbacks when the main power and the drive circuits are in close proximity to each other. Such circuits generally have a complex configuration which is sensitive to the magnetic field generated by the main power supply. The functional safety of these circuits is particularly susceptible to errors in high-speed power switching applications such as circuit breakers which have high di/dt values. In this instance, each individual conductor can produce an effect similar to an interference pulse in the circuit operation. Elimination of interference pulses is particularly critical in a drive circuit, thus requiring special protective measures as shown in DE 19628131 A1.

Optimal circuit performance is difficult to achieve because the circuit design can compensate for only a portion of all the interference sources. Sources of interference occurring in practical operation can create fluctuations of individual parameters of circuit operation. Realistically, it is difficult to design a circuit that compensates for all of the individual parameters of circuit operation. One method of providing a general overall compensation is to introduce load capacity reserves. However, such reserves are not objectively useful for circuit functionality, and still have a negative effect on total power dissipation.

The sources and range of potential interference are very large. A small portion of possible interference sources is provided here to illustrate the complexity of the compensation required to achieve satisfactory design goals.

(1) The operational safety of the power switches themselves is determined by their dynamic parameters, fluctuation within their rated ranges and the resulting variable temperature behavior.

(2) The behavior of the free-running diodes used for commutation are an imperfect match with the power switch.

(3) The geometry of the Direct Copper Bonding (DCB) ceramics that act as a direct carrier for p-n junction active line components varies across repeated parallel connections.

(4) The structure of etched copper and the tolerances intrinsic to copper etching techniques produce surfaces of different sizes which in turn cause variable capacitance values which represent variable parasitic inductance.

A reduced inductance design is desirable in even the smallest cell. However, design goals and practical embodiments seeking to reduce inductance generally differ to some extent. This problem is addressed, for example, as an object of the invention in DE 4105155A1.

As tests have shown, the potential for substantial reduction of parasitic inductances in the external circuitry are also considerable. Possible techniques that may be employed to reduce such inductances are the object of the invention in DE 4240501A1. In this prior art disclosure, positive and negative power connections are in close proximity, and are formed by several partial connections which must be made as symmetrical as possible to the individual switches.

Leakage inductance occurs in parallel switching arrangements. Parallel interconnection of several commutation circuits provokes an increased input-to-leakage inductance. Variable path lengths of parallel circuits consisting of divided DC circuits is another source of interference which leads to unwanted fluctuations in power switch drives. This problem is addressed by DE 19519538A1.

Cooling systems used in power switches are another potential source of negative effects on the tolerance of the overall system. DCB ceramic substrates are often cooled with a heat sink. As a practical matter, the cooling provided to the DCB ceramic substrate by a heat sink is unevenly distributed in temperature and location. Furthermore, the cooling performance itself must always be regarded as dynamic, since the magnitude of the total power to be dissipated can vary from one part of the DCB ceramic to the next. In addition, circuit operation causes heat sink gradient changes, which are further modified by external effects.

Qualitative parameters can affect the functional safety and load capacity of any circuit arrangement. Examples of such parameters include variable timing frequencies, phase shifts between active power and apparent power, the basic frequency of the circuit output and the intermediate circuit voltages, as well as other qualitative parameters. A portion of these parameters falls sufficiently outside the scope of a design with a minimized circuit reserve such that allowances must always be made for the loss of power.

Publications which show methods for the early recognition of destructive situations disclose means to protect circuit arrangements against overloads. These methods reduce the negative effect of overloads on functional capability, in addition to reducing the prescribed maximum power. The following publications address some of the specific negative effects.

In DE 4319254A1, a power semiconductor circuit arrangement is introduced that provides for the protection of overcurrents such as, for example, short-circuits. The overcurrent is detected using current sensors to protect the circuit arrangement against destruction. Once an overcurrent is detected, the circuit shuts off the power. The current sensors used include window comparators, error memories and lockout devices.

DE 4410978 describes a method and an associated circuit to improve the short-circuit tolerance of a bi-polar IGBT transistor. Zener diodes are used in this switching arrangement to limit the voltage between the MOSFET and the gate electrode of the IGBT.

There is a great amount of focus in the pertinent literature on the problem of short-circuits in rectifiers with IGBT or MOSFET switches. For example, EP0190925A1 discusses problems related to such short-circuits. According to the prior art, the maximum permissible forward voltage (Vce) of an IGBT, assuming a maximum permissible collector current, is related to the level of a gate current. This relationship dictates a limitation on the maximum possible power.

State of the art measures to increase the power density in circuit arrangements include using suitable parallel copper plates as conductor tracks, minimizing the live surfaces, minimizing the thickness of the insulation layer in case of closely adjacent plates of opposite poles, parallel-switching of parasitic inductivities and combining the homopolar tracks over short paths when the transmission line cross-section is large.

Recently, sensors for detecting and evaluating various parameters of power converter arrangements in real time have gained popularity. Current and temperature sensors have become routine components in circuit arrangements requiring high performance or reliability. The instantaneous signals from such sensors are generally compared with threshold values. When the measured signals exceed the threshold values, the entire system is shut down to prevent damage or destruction.

The threshold value limits are determined according to the state of the art in the conceptual design phase of circuit development. The limits are set as fixed values that are incorporated into the circuit as static figures. When a portion of the system changes, such as, for example, when a heat sink is replaced, new threshold values must be determined and incorporated into the circuit. Periodic changes in components with the accompanying individual changes in static values leads to the problem of exceeding overall operating range parameters. Since the components replaced are generally not isolated in their effects on the overall operation of the circuit, the permissible operating range for the circuit established at design time will inevitably be exceeded. The system will then be in a condition of operation outside of control design limits.

OBJECTS AND SUMMARY OF THE INVENTION

In view of the foregoing, it is an object of the present invention to overcome the drawbacks of the prior art.

It is another object of the present invention to introduce a circuit arrangement which includes all relevant operating conditions as parameters.

It is another object of the present invention to generate a self-adapting power shut-down threshold from operational parameter values, which is independent of a master control system.

It is still another object of the present invention to provide a dynamic real-time evaluation of a performance parameter characteristic field.

It is an additional object of the present invention to provide a dynamic threshold for circuit power load capacity.

It is yet another object of the present invention to provide compensated real-time information to a master control system through the use of an operational parameter based evaluation of load capacity and utilization.

Briefly stated, the present invention provides dynamic thresholds for power circuit switch operation that are calculated in real-time using instantaneous operating parameter measurements. The dynamic thresholds are self-adapting and are used to provide shutdown criteria independent of switch control systems. A characteristics field containing information related to operation parameters is used to make overload evaluations in real-time. These dynamic overload evaluations allow complete protection against thermal overload for entire power circuits in addition to power components. Reserve load capacity can also be determined based on well known component characteristics, which permits the power circuit to be driven at optimal efficiency. The power circuit output profile can also be modified in response to dynamic overload evaluation, thus preventing overload shutdown or damage to components, while operating at optimal efficiency.

The generation of a self-adapting, power shut-off threshold requires detection and standardization of all significant parameters from the power section of a circuit arrangement. The signals obtained from sensors or electric junctions are processed and evaluated in a specially incorporated drive and protective circuit.

According to the present invention, a multidimensional characteristics field is formed from measured operational parameters within a power section of a circuit. The field is evaluated for the effect of the parameters on temperature increase of the overall system comprising the circuit arrangement. Advantageously, the protective circuit according to the present invention is positioned directly on the power section of the circuit. This placement has the additional advantage that independent ambient conditions of the power switches to be protected can be used in a dynamic shut-off criterium in addition to being made available to a master controller system for real-time evaluation.

The protective circuit is based on the characteristics of the power switches, which form the basis for the dimensioning of an operational characteristics field through their design-based switching losses, their conductive-state power losses and internal thermal resistors.

Examples of operational parameters are: the temperature of the heat sink; the timing frequency; the intermediate circuit voltage; and the chronological state of the IGBT or free-running diodes. These parameters have well known and well defined values for commercial power switches that operate within the limits of their dynamic behavior or at a constant level. For example, these operating parameters form the characteristics field which leads to the instantaneously permissible threshold values which correlate to operational evaluation. The threshold values independently limit the maximum possible load at a particular point in time.

Protection of the power section of each circuit arrangement is achieved by evaluating the operating temperature and timing frequency of the system obtained by measurement of the parameters defined in the characteristics field. These parameters are always present in an operating circuit. The controller verifies compliance with prescribed limits and permitted states independent of ambient conditions.

In an actual case, the instantaneously permitted current level can be specifically determined. The determination allows a modified operation mode with reduced power or altered timing frequency, so that it becomes unnecessary to shut down the entire circuit or to extend the length of time of a potentially damaging state. An instantaneously reduced current load capacity can be selected based on the result of an evaluation provided by the characteristics field.

The characteristics field evaluation can also include additional operational parameters of the circuit arrangement and its operating range. Thus, it is possible, for example, to take into account the current status of an intermediate circuit voltage and to evaluate the length of time of current flow.

According to an embodiment of the present invention, there is provided a circuit arrangement with adaptive overload protection for power semiconductor switches comprising: means for measuring operating parameters of the switches and the circuit arrangement, means for multiplying the operating parameters effective to provide an adaptive power shut-down threshold, and the adaptive power shut-down threshold is communicated to a master control system. According to another embodiment of the present invention, there is provided a power circuit overload protection device comprising: at least one power semiconductor switch, a compensator located in close proximity to the power circuit, corrective factors produced by the compensator from measurements of operational parameters of the power circuit, dynamic overload thresholds for the at least one power semiconductor switch produced by the compensator and based on the corrective factors, and the dynamic overload thresholds are usable by a controller to optimally drive the power circuit to avoid component temperature overload.

According to another embodiment of the present invention, there is provided a power circuit overload protection device comprising: a characteristics field containing compensated real-time values of operational parameters of the power circuit, the characteristics field effective to provide dynamic overload thresholds for components of the power circuit, and the dynamic overload thresholds are compared to thermal model thresholds for the components, whereby dynamic thermal overload protection is provided for the components in the power circuit.

According to a method of the present invention, there is provided a method for providing dynamic thermal overload protection for a power circuit component, comprising the steps: measuring operational parameter values of the power circuit component, modifying the operational parameter values to provide compensated values, multiplying the compensated values associated with power losses to provide a per switch measure of power losses, multiplying the compensated values associated with switching losses to provide a per switch measure of switching losses, combining the per switch measure of power losses with the per switch measure of switching losses to provide a total load of the power circuit component, comparing the total load with a maximum load for the power circuit component to provide a load capacity, and communicating the load capacity to a controller, whereby the power circuit component can be driven to prevent thermal overload.

In summary, the present invention provides a means for limiting the current according to the state of the circuit operation parameters on the basis of a complex characteristics field. Internal analog signal processing in the characteristics field permits response times with a very short delay time of less than 1 ms. A D/A converter in conjunction with a microprocessor or signal processor allows the resulting characteristics field information to be used with digital interfaces.

The above and other objects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
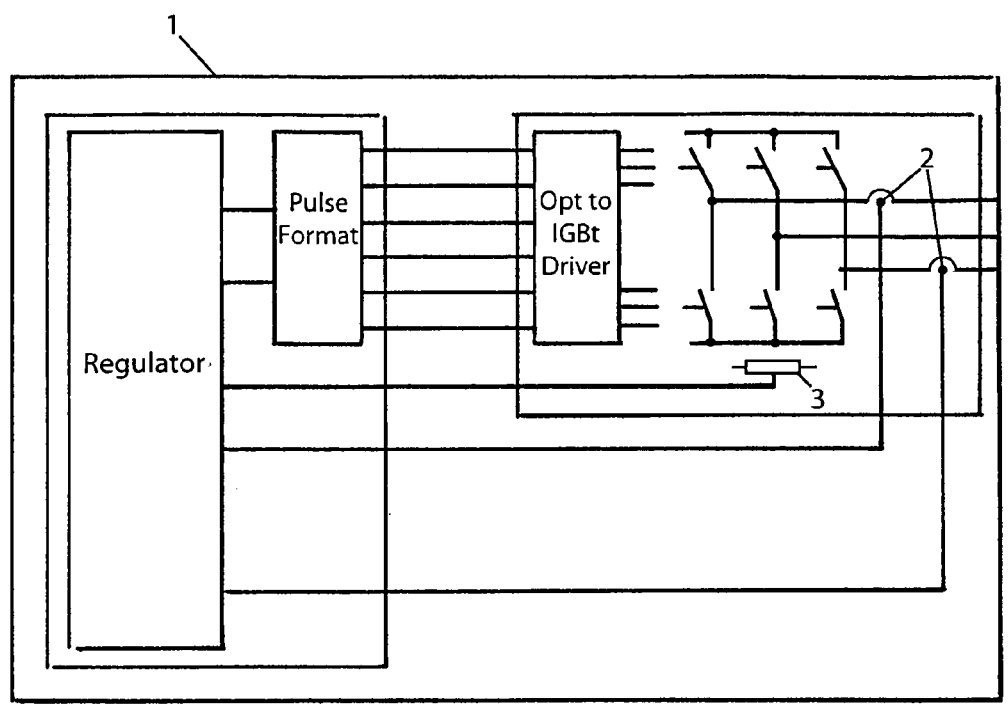
FIG. 1 shows the modern state of circuit technology.

Referring to FIG. 1, a conventional power converter is shown according to the modern state of the art in circuit technology. Converter 1 has output currents monitored by current sensors 2, and temperatures monitored by sensor mounted on a heat sink 3. The circuit provides current overload protection by comparing the instantaneous value of the current signal with a threshold value which lies outside the normal operating value range. When the threshold value is exceeded, the total system, i.e. the circuit arrangement, is shut off.

In such systems, threshold values are determined on the basis of thermal measurements made during circuit development and testing phases. It is also during the circuit development phase that forecasts for permitted loads are made for a range of certain heat-sink temperatures. These forecasts form the basis of the threshold values of all subsequently established arrangements. A static thermal model of the circuit arrangement for the specified components is established.

The circuit arrangement shown in FIG. 1 has the disadvantage that replacement of components in the power section requires that new threshold values must be determined with new thermal measurements. For example, when a heat sink other than that originally specified is incorporated into the circuit, a whole new static thermal model for the circuit arrangement must be determined.

The threshold values are static in nature and must be individually calculated and determined for each individual parameter every time a component is replaced. Every dynamic change in the circuit arrangement including undervoltages in the ventilation system, contamination of the cooling profiles, or fluctuating ambient temperatures, causes a change in the performance response profile of the circuit. The fluctuations and dynamic changes must be considered to determine the static thresholds and evaluation of workload reserve capacity.

In addition, the optimal capability of such a circuit configuration cannot be fully realized with this conventional design. The design provides that in each case, the most unfavorable operating conditions must be used to determine the threshold limit values, which results in overdesign of the circuit to meet operating criteria, producing a considerable reduction in available power.

In Hei-7-255166, a thermal overload protection scheme is disclosed that protects the power components of a converter at a low output frequency. The disclosure discusses the determination of a time interval, after which the temperature limit of the power component would be exceeded for a given load. Before reaching the end of the time interval, the converter is shut off if the load conditions are unchanged.

EP0792008A2 describes a method and a mechanism for thermal overload protection in converters with sinusoidal output values. The method includes an evaluation of the temperature rise of components. When a defined temperature increase limit is exceeded, the duty ratio of the device is reduced to avoid thermal overload of the power component.

Figure 2:
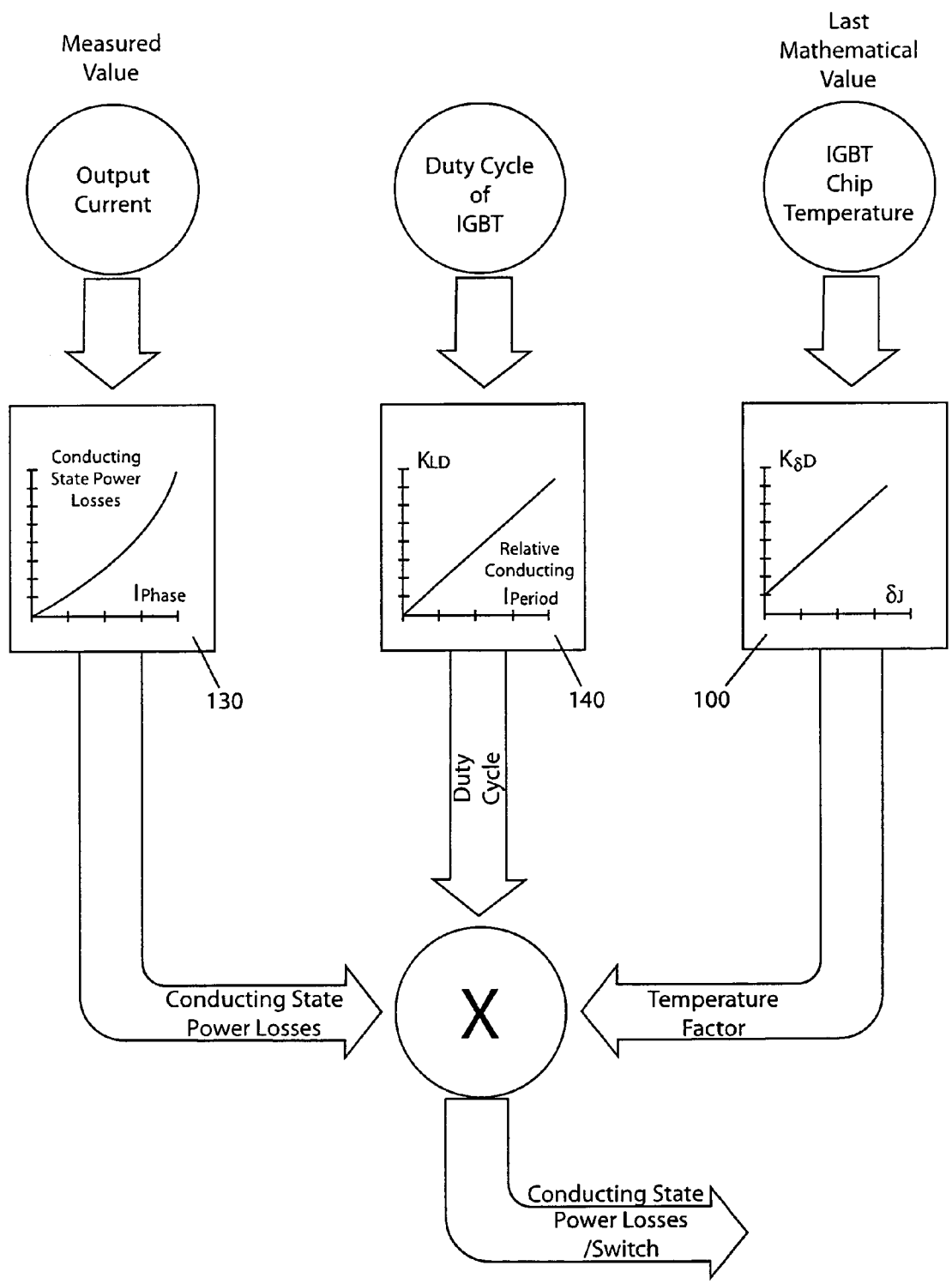
FIG. 2 shows a process diagram of the determination of conducting-state power losses.

Referring to FIG. 2, a sketch describing a method according to the invention for determining conducting-state power losses is shown. The determination of the conduction loss is explained using examples, including IGBT structures, under actual operating conditions. The high inertia of heat transport makes it important for temperature measurements to be taken at the heat source origin. Such origin-located measurements are a primary principle behind the present invention. The place of origin can be found in the p-n junctions of the power transistors and diodes, and therefore, measured values and measurements are taken directly at those components.

The conducting-state power losses are defined by the electric energy which is converted into heat. Depending on an output current $I_{phase}$, the conducting-state power losses are determined for the power components used in standard operations and used in the evaluation. The heat generated and dissipated in the conducting phase of the IGBT depends functionally on the amount of the transported output current $I_{phase}$. The transported output current $I_{phase}$ is thus a significant switching parameter for overload protection, and is measured by a current sensor.

According to the conventional technology, power losses in semiconductor devices are calculated according to the following algorithm:

$$P_{VTransistor} := \frac{1}{2} \cdot \left[ \frac{V_{CEO} + \Delta V_{CEO} \cdot (\theta_j - \theta_{data})}{\pi} \cdot i + \frac{R_{CE} + \Delta R_{CE} \cdot (\theta_j - \theta_{data})}{4} \cdot i^2 \right] + \bullet \ldots +$$
$$m \cdot \cos\Phi \left[ \frac{V_{CEO} + \Delta V_{CEO} \cdot (\theta_j - \theta_{data})}{8} \cdot i + \frac{R_{CE} + \Delta R_{CE} \cdot (\theta_j - \theta_{data})}{3 \cdot \pi} \cdot i^2 \right] + \bullet \ldots +$$
$$\frac{1}{\pi} \cdot f_{sw} \cdot [Esw + \Delta Esw \cdot (\theta_j - \theta_{data})] \cdot \frac{V_{DC}}{V_{DCdata}} \cdot i$$

$$P_{VDioder} := \frac{1}{2} \cdot \left[ \frac{V_{FO} + \Delta V_{FO} \cdot (\theta_j - \theta_{data})}{\pi} \cdot i + \frac{R_F + \Delta R_F \cdot (\theta_j - \theta_{data})}{4} \cdot i^2 \right] - \bullet \ldots +$$
$$m \cdot \cos\Phi \cdot \left[ \frac{V_{FO} + \Delta V_{FO} \cdot (\theta_j - \theta_{data})}{8} \cdot i + \frac{R_F + \Delta R_F \cdot (\theta_j - \theta_{data})}{3 \cdot \pi} \cdot i^2 \right] + \bullet \ldots +$$
$$\frac{1}{\pi} \cdot f_{sw} \cdot [Esw + \Delta Esw \cdot (\theta_j - \theta_{data})] \cdot \frac{V_{DC}}{V_{DCdata}} \cdot i$$

This complex calculation requires a very efficient and very costly microprocessor. In a universal power device, the values of $\cos\Phi$ and of the modulation factor are not known. For these reasons, other ways of calculating losses have to be found.

To make the calculation simpler, the loss performance of a defined status is calculated and stored (separated between switch loses and conducting-state power losses) in a table of "loss performance dependent on the output current." The calculation of losses in an unknown status is as follows.

$$P_{VTransistor}(n) := P_{VswTBasis}(Iac) \cdot \frac{fsw}{fswBasis} \cdot \frac{V_{ZK}}{V_{ZKBasis}} \cdot \frac{T_{jT(n-1)}}{T_{jTBasis}} \cdot K_{Tjsw} \cdot \bullet \ldots +$$
$$P_{VcondTBasis}(Iac) \cdot \frac{tCP}{t_{CPTBasis}} \cdot \frac{T_{jT(n-1)}}{T_{jTBasis}} \cdot K_{Tjcond}$$

The output current of the rectifier is measured. A value (basic loss) according to this measurement is taken from the above stored table. Further measured values are timing frequency, intermediate circuit voltage, actual conducting period, and starting value of the junction temperature.

To evaluate the loss performance, the measured values are set into relation to the pertaining values of the basic loss calculation and now are factors with which the basic losses have to be multiplied. With given temperature influences, one has to multiply also with a temperature coefficient. Also, it should be noted that the temperature value is always the value of the foregoing calculation, and not the actual temperature, which could lead to a small fault.

$$P_{VDiode}(n) := P_{VswDBasis}(Iac) \cdot \frac{fsw}{fswBasis} \cdot \frac{V_{ZK}}{V_{ZKBasis}} \cdot \frac{T_{jD(n-1)}}{T_{jDBasis}} \cdot K_{Djsw} \cdot \bullet \ldots +$$
$$P_{VcondDBasis}(Iac) \cdot \frac{tCPD}{t_{CPDBasis}} \cdot \frac{T_{jD(n-1)}}{T_{jDBasis}} \cdot K_{Djcond}$$

The variables found in the above equations are defined as follows:

$P_{VTransistor}(n)$: actual loss performance in a transistor; $P_{VswTBasis}(Iac)$: basic switching loss in a transistor; $P_{VcondTBasis}(Iac)$: basic conducting state power loss; $P_{VDiode}(n)$: actual loss performance in a diode; $P_{VswDBasis}(Iac)$: basic switching loss in a diode; $P_{VcondDBasis}(Iac)$: basic conducting state power loss; fsw: actual switching frequency; fswBasis: switching frequency in basic status; $V_{ZK}$: actual intermediate circuit voltage; $V_{ZKBasis}$: basic intermediate circuit voltage; $T_{jT(n-1)}$: junction temperature of the forego-ing calculation (transistor); $T_{jD(n-1)}$: junction temperature of the foregoing calculation (diode); $T_{jTBasis}$: junction temperature of the basic status (transistor); $T_{jDBasis}$: junction temperature of the basic status (diode); $K_T \ldots, K_D \ldots$: constant of chip describing the influence on the overall result; $t_{CP}$: conducting period.

Another significant switching parameter is the duty cycle, or relative conducting period. The duty cycle may comprise, for example, the switching period of an IGBT. This parameter is key to controlling the permissible load capacity of the circuit arrangement. A correction factor $K_{LD}$ is used to relate the actual conducting period to the switching period of the component during standard operation (the relative conducting period).

The actual junction temperature is another significant parameter for overload protection. To arrive at the actual junction temperature, the present invention records and evaluates a chip temperature $\delta_J$. Compensation for chip temperature $\delta_J$ to arrive at the semiconductor junction temperature is crucial for the functional operation of the overload protection.

A temperature correction factor $K_{\delta D}$ is generated from the actual junction temperature. The actual junction temperature is current-dependent, and is directly related to baseline conducting-state power losses. The power losses cause an increase in chip temperature that is dependent on the magnitude of the power dissipation. In addition, the chip temperature can be increased passively, from heat generated by other components due to power dissipation. Other components are positioned on thermally inter-connected carriers relative to the chip, and thus are more likely to contribute to indirect passive heating.

Generally, each individual chip receives a passive heat load from heat transferred indirectly from heat sinks or conductive carriers. If the power switch operates in an unfavorable environment, such as one with high ambient temperatures, performance of the switch decreases accordingly.

The method in FIG. 2 uses the heat sink temperature as the starting value to calculate the temperature compensation, or correction factor $K_{\delta D}$. Successive values of correction factor $K_{\delta D}$ are then determined from the previously calculated junction temperature. Correction factor $K_{\delta D}$ is calculated according to the temperature characteristics of the junction, and the actual junction temperature for the particular IGBT chip. A new actual junction temperature is then determined from chip temperature $\delta_J$ and correction factor $K_{\delta D}$.

The conducting state power losses, duty cycle and temperature factor are multiplied together to produce a conducting-state power losses value for each switch. The result is used in a digital evaluation unit (e.g., a micro-controller).

Figure 3:
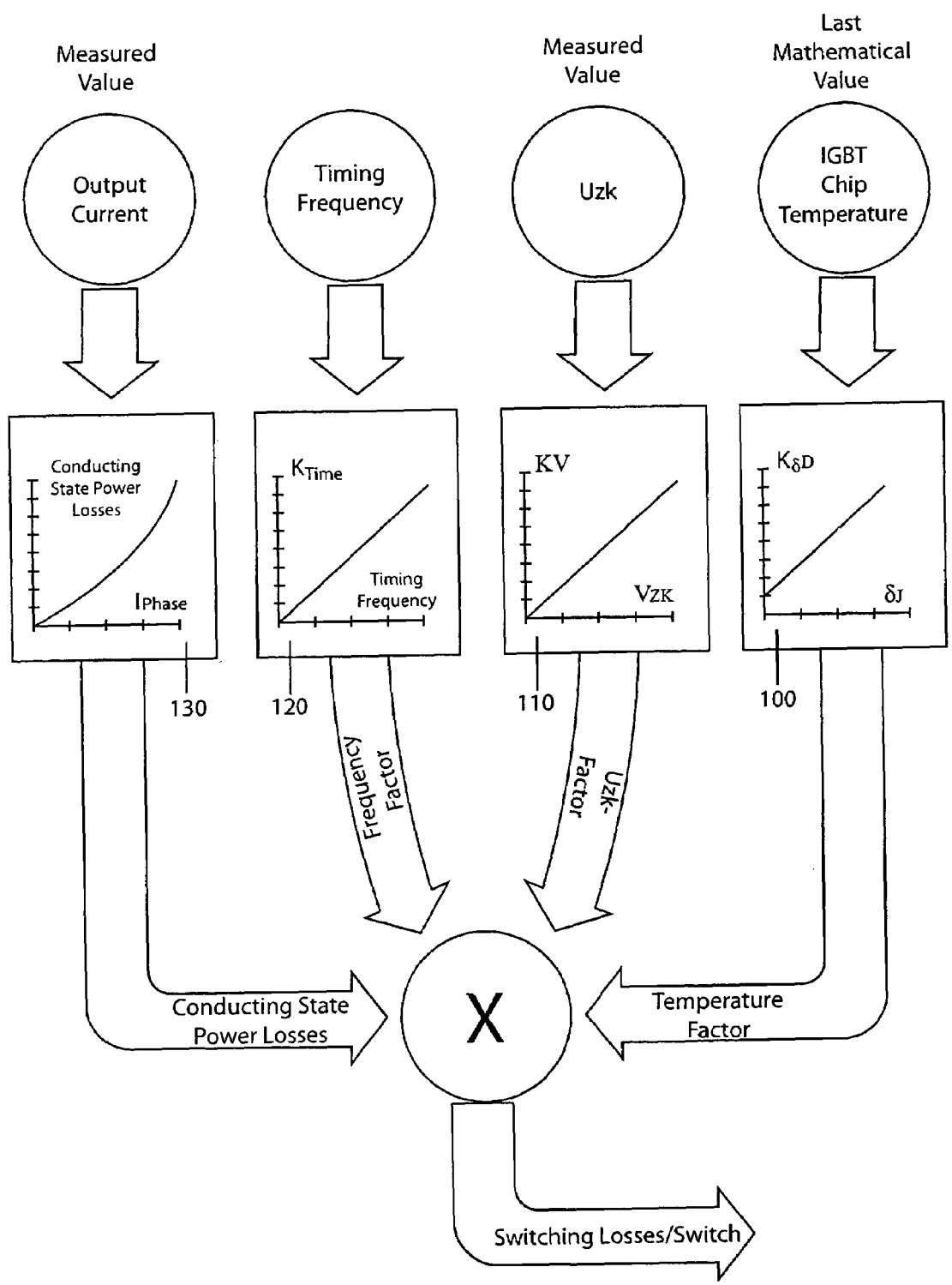
FIG. 3 shows a process diagram of an example for the determination of switching losses.

Referring to FIG. 3, a sketch of an example for determining switching power losses is shown. The data are drawn from the actual operating conditions of an IGBT, as an example. This calculation for switching power losses uses four factors as shown.

From the output current ($I_{phase}$) information pertaining to baseline switching losses is gathered and used as a power indicator for the semiconductor components used in standard operation. The first factor, conducting-state power losses, depends on the phase current in subsequent evaluations.

The timing frequency and the realizable clock rate are used to determine the frequency factor after application of a correction factor $K_{time}$. In the same manner, the factor of intermediate circuit voltage $V_{zk}$ is determined after application of correction factor KV. In a manner analogous to that shown in FIG. 2, the fourth value, chip temperature $\delta_J$, is determined and used to indicate switching losses. A temperature correction factor $K_{\delta S}$ is determined from the actual junction temperature for the current-independent losses. Correction factor $K_{\delta S}$ is then used to calculate a temperature factor.

The product of the above four factors shown in FIG. 3 results in a calculated value of switching losses per switch. This calculated value reflects the actual switching losses of the semiconductor component.

The sum of conduction losses and switching losses per switch (IGBT and free-running diode) constitutes the total load attributable to each semiconductor chip. These values are used as inputs into a thermal model of the circuit arrangement to determine an actual chip temperature $\delta$.

From the difference between actual chip temperature $\delta$ and the maximum chip temperature allowed, the actual instantaneous maximum possible output current is determined. Having determined the maximum possible output current available, the actual workload capacity of the power system is known. Furthermore, the available reserve capacity and drive capability of the power system is known to the maximum available limit. With this information, a master control can determine utilization tendencies and plan for changes in drive requirements.

Figure 4:
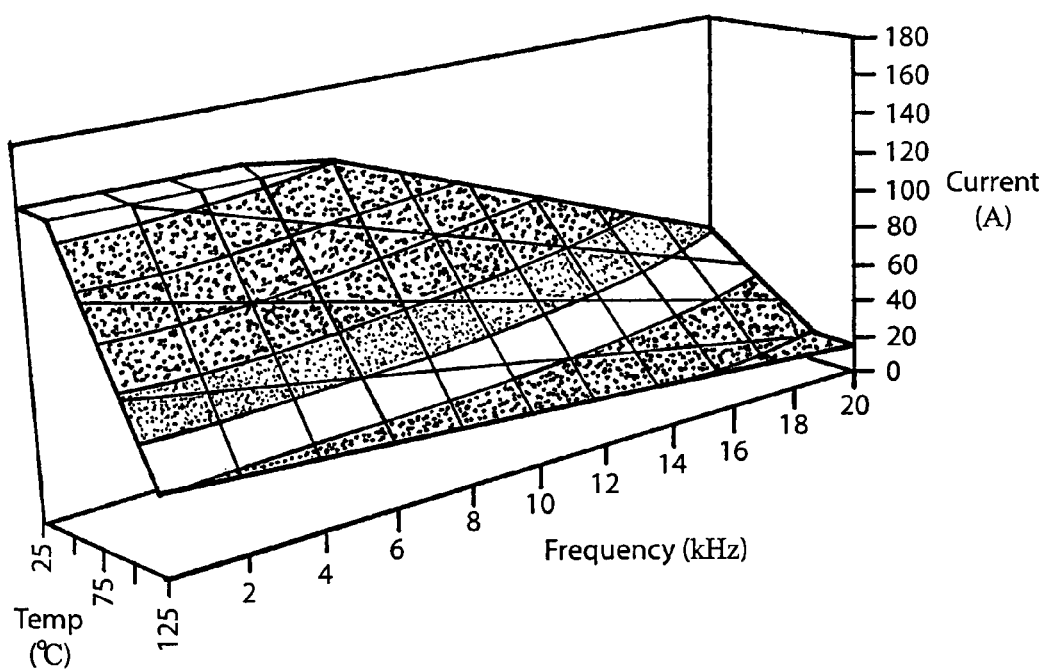
FIG. 4 shows a graph of a three-dimensional characteristics field according to the invention with two input signals.

FIG. 4 shows a sketch of a three-dimensional characteristics field according to the invention with two input signals, temperature and operating frequency. The complex effect of only two variables shows the enormous implications for the current load capacity. Even with substantial cooling, i.e., at temperatures below 50° C., the load capacity at 20 kHz drops to about half, and with inadequate cooling the load capacity is reduced to a quarter of the above value.

In practical application, several variables must be considered in addition to temperature and operating frequency. A characteristics field that includes all parameters has a simultaneous effect on circuit evaluation and operation according to a thermal model. Depending on instantaneous load current, the parameters in the characteristics field influence chip temperature $\delta_J$ of the power switches and free-running diodes in different ways. Given a maximum permissible temperature for all components of the circuit arrangement that add to power dissipation, each operating semiconductor body will have a characteristic temperature rise that is determinable. The determinable temperature rise provides a dynamic threshold capability for changing the permissible current load capacity.

The above dynamic threshold is an object of the invention. The dynamic threshold is self-adapting and permits implementation of an overload shut-off to avoid damaging or destroying the circuit. In addition, such a dynamic threshold allows the system to be driven at reduced power levels when necessary to avoid shutdown, and an error message can be generated to a master control or operator indicating the problem encountered.

The present invention avoids dependence on sinusoidal current path measurements and associated power factors. In contrast to sinusoidal dependence, only the actual conducting period of each individual component is needed. The present invention therefore constitutes an application-independent protection method that can be used in all hard-switching type systems. Such systems include synchronous motors, brushless DC motors, power supplies and welding devices. The location of the protective device in close proximity to the power section of the protected system enables the invention to achieve application independence. Such a power section may range from a switch with a free-running diode in the simplest case, to a half bridge or H bridge in a more complex situation.

Regarding the described operating parameters, the most weight is given to temperature dependence of the components. The effect of the intermediate circuit voltage is also highly weighted. The heat sink temperature is measured and recorded as the beginning value for the calculation of actual chip temperature $\delta_J$. All of the collected data determines the actual utilization of the circuit arrangement, which is then made available to the master control system. Using this information, load reduction or frequency reduction can be achieved to reduce the actual thermal load, thus avoiding shutdown when temperature limits are exceeded.

Figure 5:
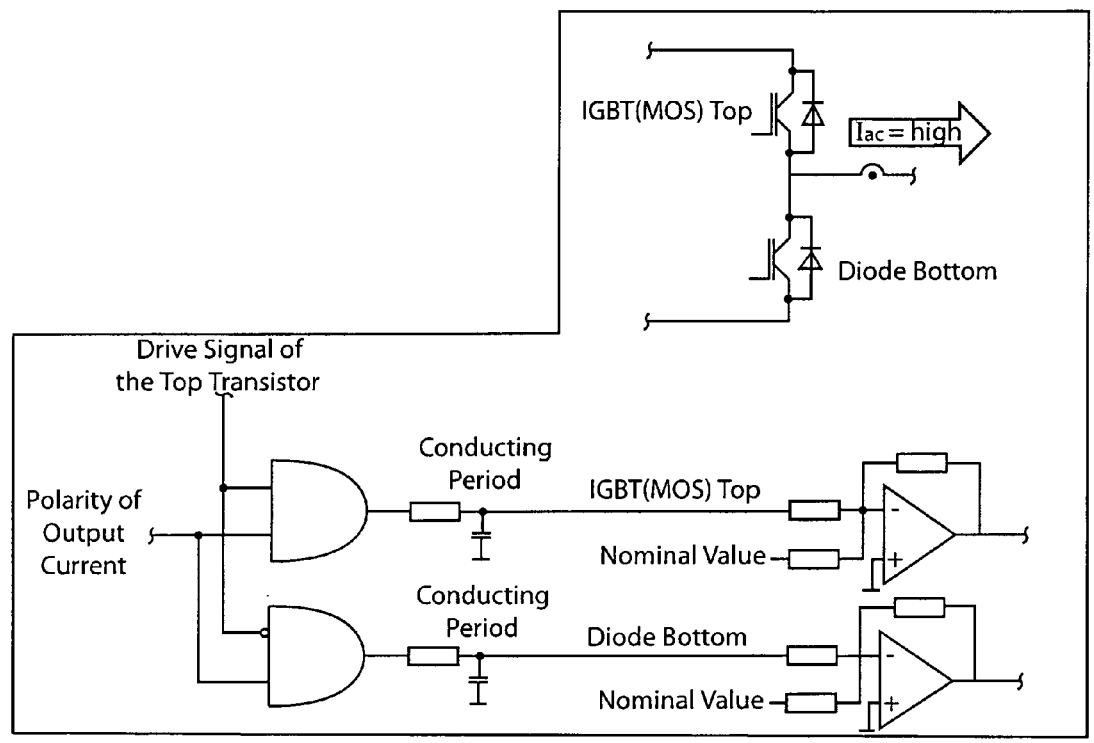
FIG. 5 shows a sketch of a partial circuit of the signal generation according to the invention.

Referring to FIG. 5, a sketch of a partial circuit for signal generation according to the present invention is shown. An example of the determination of a component conducting period is shown using an excerpt of a circuit arrangement according to the present invention. The circuit shown is the commutation circuit of an IGBT in the TOP position and a free-running diode in the BOTTOM position of a half bridge. Positive output current flowing from this circuit branch is the equivalent of a HIGH signal level. When the control signal shows a HIGH signal level, the IGBT is driven.

In this switching state, either of the BOTTOM free-running diode or the TOP transistor can be conducting. Thus, the polarity of an output current Iac determines whether the TOP transistor or the BOTTOM free-running diode is active. When output current Iac is positive, the TOP transistor is driven and is conducting while the free-running diode is turned off.

The AND coupling of current polarity and TOP transistor drive signal produces a HIGH signal at the output when the current is positive and the TOP transistor is ON. This HIGH signal is characteristic of the ON state of the TOP transistor. The output signal is compared with a standardized signal to provide information about the relative ON state time interval of the TOP transistor.

The AND coupling of current polarity and inverted TOP transistor drive signal has a HIGH signal at the output when the current is positive and the TOP transistor is OFF. This HIGH signal is characteristic of the ON state of the free-running diode. The output signal is compared with a standardized signal to provide information about the relative ON state time interval of the free-running diode.

If online temperature recording is used, the power section can be protected completely against thermal overloading. The calculations needed to determine losses require extensive mathematical operations which are economically impracticable with analog circuits. A low cost micro-controller can be used as an alternative to perform the calculations needed to realize the invention.

A digital calculation solution also allows other functions to be realized. For example, an electronic signature can be produced or recorded. Digital data can be exchanged with a regulator to permit display of detailed error messages with a digital value instead of summary error identification. Real-time values for chip temperatures and heat sink temperatures and the resulting current limits are also available.

Figure 6:
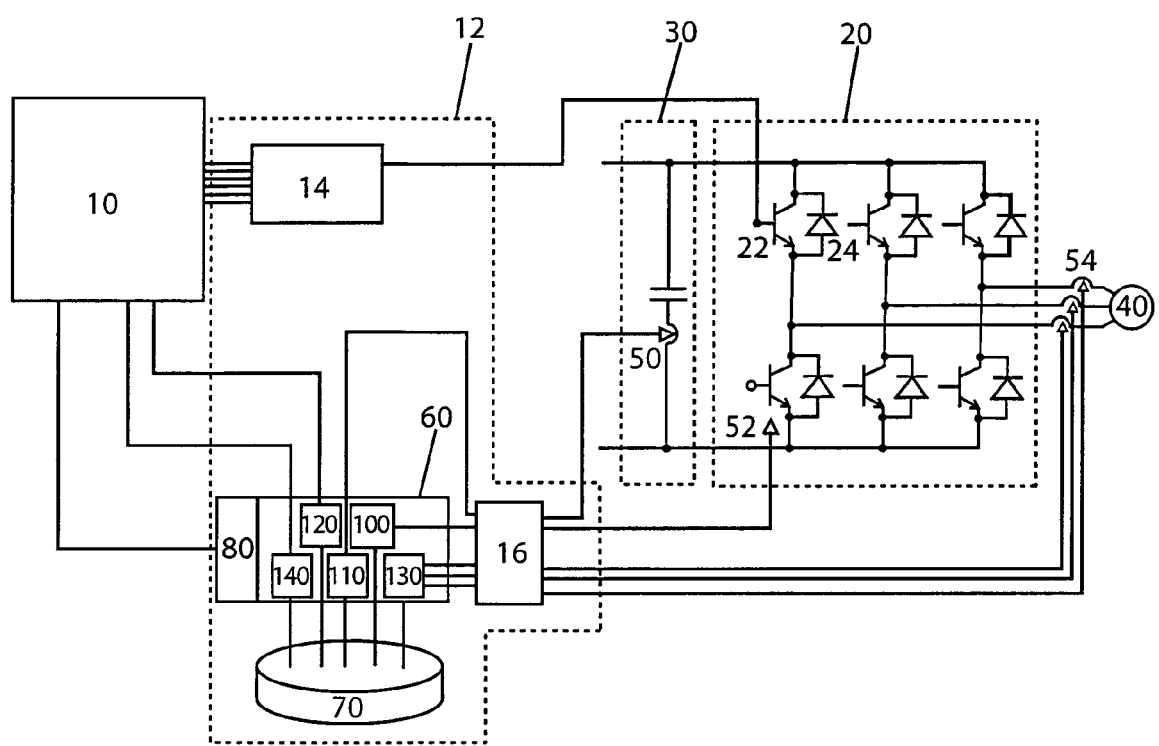
FIG. 6 shows the use of a circuit arrangement based on a system for controlling a 3-phase motor.

FIG. 6 illustrates the use of the circuit arrangement system according to the invention based on the example of a system for controlling a 3-phase motor 40. The system comprises: a master control system 10; an intermediate DC voltage circuit 30; a 3-phase bridge circuit 20, comprising power transistors, preferably IGBTs 22, as well as anti-parallel free-running diodes 24; a motor 40; an intelligent control circuit 12; and sensors 50, 52, and 54. The intelligent control circuit 12 comprises a digital interface 16, a data storage memory 70 for storing the correction factors; a compensator 60, a multiplication stage 80, a driver circuit 14, and a processor (not shown).

The system is controlled by master control system 10 which controls IGBTs 22 of bridge circuit 20 through the gates of the IGBTs by means of the input signals of a driver circuit 14 of an intelligent control circuit 12. The power supply of the bridge circuit is provided by intermediate circuit 30. The system has current sensors 54 in the supply lines for all of the three phases of motor 40, and it further has at least one temperature sensor 52 for the subsequent determination of the temperature of the pn-transition. The temperature sensor is arranged closely adjacent to an IGBT. Thus, a temperature surveillance is performed for a point where the temperature is known based on the known design of the system, in this case a semiconductor module, and based on the theoretical model for the thermal correlation between the temperature at the point of surveillance and the junction temperature of the IGBT. Intermediate circuit 30 further has a voltage sensor 50.

In compensator 60, which is part of intelligent control circuit 12 of the power component, the measurement values of all sensors are evaluated by means of correction factors stored in a data storage memory 70 and subsequently normalized 100, 110, and 130. In the same manner, compensator 60 evaluates the values delivered by the master control system such as the clock frequency and/or the on-period of the IGBTs. Compensator 60 also adjusts the values by means of the correction factors from data storage memory 70 and normalizes values 120 and 140.

All of the normalized values are combined in a multiplication stage 80 for the determination of the leakage and/or switching losses. The details of this process are described below.

By means of sensors 50, 52, and 54, the circuit arrangement continuously measures at least two directly measurable operating parameters of the power semiconductor components and/or of the overall system. Each of the parameter values determines a point of a normalized characteristic curve that is stored in data storage memory 70. The point represents the correction factor. A plurality of characteristic curves together represent a so-called characteristic curve field or characteristic array. In multiplication stage 80, the individual correction factors are multiplied by the baseline loss values that have been obtained in a defined mode of operation and have likewise been stored in data storage memory 70.

The result of the multiplication of the correction factors with the baseline loss values represents the power lost in the IGBT or the diode. By evaluating the power loss with the thermal model correlation between temperature sensor 52 and the junction, it is possible to calculate the junction temperature of the semiconductor. When the temperature differential between junction and sensor is divided by the differential between a "permissible junction temperature" and the sensor temperature, the value of the ratio represents a measure for the momentary load level of the IGBT and/or the diode. This information is made available to master control system 10 to adjust operating mode parameters and thereby avoid an emergency shut-down in case of an overload.

In another embodiment, all or part of intelligent circuit 12 and/or master control system 10 may be implemented by a microprocessor, micro-controller, or a digital evaluation unit as previously described and discussed.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

We claim:

1. A circuit arrangement operable under control of a master control system to provide adaptive overload protection for power semiconductor switches with anti-parallel free-running diodes in a power supply system, comprising:

sensors for continuously monitoring at least two directly measurable operating parameters of at least one of said semiconductor switches and said power supply system;

a data storage memory for storing correction factors in the form of characteristic curve fields and for storing baseline power loss values measured in a defined operating mode of the power supply system;

a means for determining applicable correction factors based on current values of said directly measurable operating parameters and based on said characteristic curve fields;

a multiplication stage for multiplying the baseline power losses with the applicable correction factors to determine an amount of power lost in the semiconductor switches;

a means for determining a junction temperature of the semiconductor switches based on said amount of lost power, using a theoretical thermal model of said semiconductor switches;

a comparator means for comparing said junction temperature to a maximum permissible temperature; and a means for transmitting a result of said comparison to the master control system so that operating mode parameters of the power supply system can be adjusted and an emergency shut-down can be prevented in a case where said comparator means indicates a thermal overload condition.

2. A circuit arrangement according to claim 1, wherein said parameters include:
a temperature of at least one p-n junction of said switches;
a temperature of at least one heat sink;
timing frequencies of said switches;
at least one intermediate circuit voltage for said switches;
an output current;
an output polarity; and
a duty cycle of said switches.

3. A circuit arrangement according to claim 1, wherein said adaptive power shut-down threshold is calculated based on a temperature simulation of said circuit arrangement.

4. A circuit arrangement according to claim 2, wherein said operating parameters are digitized and processed by a digital signal processing system.

5. A circuit arrangement according to claim 4, further including:
a digital interface;
said digital interface capable of communicating said operating parameters, whereby said operating parameters provide individual evaluation of:
operation of said circuit arrangement;
actual utilization limits of said circuit arrangement; and
available power reserves of said circuit arrangement.

6. A power circuit overload protection device comprising:
at least one power semiconductor switch;
a compensator located in close proximity to a power circuit;
corrective factors produced by said compensator from measurements of operational parameters of said power circuit;
dynamic overload thresholds for said at least one power semiconductor switch produced by said compensator and based on said corrective factors;
said dynamic overload thresholds are usable by a controller to optimally drive said power circuit to avoid component temperature overload;
said operational parameters include:
a temperature of a p-n junction of said at least one power semiconductor switch;
a temperature of at least one heat sink;
timing frequencies of said at least one power semiconductor switch;
at least one intermediate circuit voltage of said at least one power semiconductor switch;
an output current;
an output polarity; and
a duty cycle of said at least one power semiconductor switch.

7. A power circuit overload protection device according to claim 6, wherein:
said at least one power semiconductor switch include at least one of an IGBT and MOSFET switch; and
said at least one power semiconductor switch having an associated free-running diode.

8. A power circuit overload protection device according to claim 6, wherein said dynamic overload thresholds are effective to determine a reserve load capacity for said power circuit.

9. A power circuit overload protection device according to claim 6, wherein said dynamic overload thresholds are effective to enable a controller to modify a drive profile to prevent thermal overload.

10. A power circuit overload protection device comprising:
a characteristics field containing compensated real-time values of operational parameters of said power circuit;
said characteristics field effective to provide dynamic overload thresholds for components of said power circuit;
said dynamic overload thresholds are compared to thermal model thresholds for said components, whereby dynamic thermal overload protection is provided for said components in said power circuit;
said operational parameters include:
a temperature of a p-n junction of said at least one power semiconductor switch;
a temperature of at least one heat sink;
timing frequencies of said at least one power semiconductor switch;
at least one intermediate circuit voltage of said at least one power semiconductor switch;
an output current;
an output polarity; and
a duty cycle of said at least one power semiconductor switch.

11. A method for providing dynamic thermal overload protection for a power circuit component, comprising the steps:
measuring operational parameter values of said power circuit component;
modifying said operational parameter values to provide compensated values;
multiplying said compensated values associated with power losses to provide a per switch measure of power losses;
multiplying said compensated values associated with switching losses to provide a per switch measure of switching losses;
combining said per switch measure of power losses with said per switch measure of switching losses to provide a total load of said power circuit component;
comparing said total load with a maximum load for said power circuit component to provide a load capacity; and
communicating said load capacity to a controller, whereby said power circuit component can be driven to prevent thermal overload.

12. A method for providing dynamic thermal overload protection for a power circuit component according to claim 11, wherein:
said operational parameters include:
a temperature of at least one p-n junction of said power circuit component;
a temperature of at least one heat sink;
timing frequencies of said power circuit component;
at least one intermediate circuit voltage of said power circuit component;
an output current;
an output polarity; and
a duty cycle of said power circuit component.

* * * * *

UNITED STATES PATENT AND TRADEMARK OFFICE
CERTIFICATE OF CORRECTION

PATENT NO.         : 7,035,064 B2                         Page 1 of 1
APPLICATION NO.  : 10/411875
DATED              : April 25, 2006
INVENTOR(S)        : Ernst Schimanek et al.

It is certified that error appears in the above-identified patent and that said Letters Patent is hereby corrected as shown below:

On The Title Page:

In the Inventor's place of residence:

Please delete "Ernst Schimanek, Nuremberg (DE)" and "Markus Billmann,

Nuremberg (DE)" and substitute

-- Ernst Schimanek, Nurnberg (DE) -- and -- Markus Billmann, Nurnberg (DE) --.

Signed and Sealed this

Twenty-second Day of August, 2006

JON W. DUDAS
*Director of the United States Patent and Trademark Office*